United States Patent [19]

Farid et al.

[11] Patent Number: 4,743,528

[45] Date of Patent: May 10, 1988

[54] ENHANCED IMAGING COMPOSITION CONTAINING AN AZINIUM ACTIVATOR

[75] Inventors: Samir Y. Farid, Rochester; Neil F. Haley, Fairport; Roger E. Moody; Donald P. Specht, both of Rochester, all of N.Y.

[73] Assignee: Eastman Kodak Company, Rochester, N.Y.

[21] Appl. No.: 933,657

[22] Filed: Nov. 21, 1986

[51] Int. Cl.$^4$ ................................................ G03C 1/76
[52] U.S. Cl. ..................................... 430/281; 430/286; 430/287; 430/919; 430/920; 522/25
[58] Field of Search ............... 430/281, 919, 920, 286, 430/287; 522/25

[56] References Cited

U.S. PATENT DOCUMENTS

| Re. 27,922 | 12/1974 | Heseltine et al. | 430/919 |
| Re. 27,925 | 2/1974 | Jenkins et al. | 430/919 |
| 3,203,801 | 8/1965 | Heiart | 430/919 |
| 3,933,682 | 1/1976 | Bean | 430/920 |
| 4,289,843 | 9/1981 | Boutle et al. | 430/919 |
| 4,353,787 | 10/1982 | Alexander et al. | 430/919 |
| 4,576,975 | 3/1986 | Reilly | 430/919 |

FOREIGN PATENT DOCUMENTS 2083832A 9/1981 United Kingdom ................ 430/920

OTHER PUBLICATIONS

*Research Disclosure*, vol. 200, Dec. 1980, item 20036.
Specht, Martic, and Farid, "A New Class of Triplet Sensitizers", Tetrahedron, vol. 38, pp. 1203–1211, 1982.

*Primary Examiner*—Jack P. Brammer
*Attorney, Agent, or Firm*—Carl O. Thomas

[57] ABSTRACT

An imaging composition is disclosed comprised of an organic component containing ethylenic unsaturation sites and capable of selective hardening by addition at the sites of ethylenic unsaturation, an azinium salt activator, a photosensitizer having a reduction potential which in relation to the reduction potential of the azinium salt activator is at most 0.1 volt more positive, and an image enhancing amount of benzene substituted with an electron donating amino group and one or more groups capable of imparting a net Hammett sigma value electron withdrawing characteristic of at least +0.20 volt to said benzene ring.

20 Claims, No Drawings

ENHANCED IMAGING COMPOSITION CONTAINING AN AZINIUM ACTIVATOR

FIELD OF THE INVENTION

This invention relates to photography. More specifically, this invention relates to novel imaging compositions and to novel coated articles containing these imaging compositions.

BACKGROUND OF THE INVENTION

A variety of photographic imaging systems are known wherein a hardenable organic component containing ethylenic unsaturation sites is relied for image formation. The organic component undergoes photoinduced addition reactions, typically either polymerization or crosslinking, at the ethylenic unsaturation sites which produce hardening and allow image discrimination to be achieved.

It is common practice in preparing these compositions to employ coinitiators. One of the coinitiators is a photosensitizer. Photosensitizers are relied upon to capture photons of exposing radiation. The remaining coinitiator is referred to as an activator. The activator is not relied upon to respond directly to exposing radiation, but rather adjacent activator and photosensitizer molecules react, following excitation of the latter by photon capture, causing release by the activator of a free radical which in turn induces immobilizing addition reactions at sites of ethylenic unsaturation.

It is generally accepted that photosensitizer coinitiators function by photon absorption to lift an electron from an occupied molecular orbital to a higher energy, unoccupied orbital. The spin of the electron lifted to the higher energy orbital corresponds to that which it exhibited in its original orbital or ground state. Thus, the photosensitizer in its initially formed excited state is in a singlet excited state. The duration of the singlet excited state is limited, typically less than a few nanoseconds. The excited photosensitizer can return from its singlet excited state directly to its original ground state, dissipating the captured photon energy. Alternatively, the singlet excited state photosensitizer in some instances undergoes intersystem crossing through spin inversion to another excited state, referred to as a triplet state, wherein lifetimes are typically in the microsecond to millisecond range. Since photosensitizer coinitiators which exhibit triplet states remain in an excited state for time periods that are orders of magnitude greater than photosensitizer coinitiators which exhibit only singlet excited states, a much longer time period is available for reaction with the paired activator coinitiator.

Specht and Farid U.K. No. 2,083,832A discloses photopolymerization coinitiators including azinium activators and amino-substituted 3-ketocoumarin and naphthothiazole merocyanine photosensitizer coinitiators which exhibit triplet states on excitation. While most of the photosensitizers absorb primarily in the ultraviolet portion of the spectrum, some are yellow dyes with absorption maxima ranging up to 480 nm in wavelength. An essentially cumulative disclosure is provided by *Research Disclosure*, Vol. 200, December 1980, Item 20036. *Research Disclosure* is published by Kenneth Mason Publications, Ltd., Emsworth, Hampshire P010 7DD, England. As illustrated by Specht, Martic, and Farid, "A New Class of Triplet Sensitizers", *Tetrahedron*, Vol. 38, pp. 1203-1211, 1982, these amino-substituted 3-ketocoumarins exhibit intersystem crossing efficiencies ranging well above 10 percent—e.g., from 0.18 to 0.92 or 18 to 92 percent.

Specht and Farid in comparative examples demonstrate the performance of ethyl diethylaminobenzoate as an activator in place of the N-oxyazinium activators disclosed. The results show that the ethyl diethylaminobenzoate exhibits comparatively low speeds with amino-substituted coumarins as compared to oxy-substituted coumarins.

In concurrently filed, commonly assigned patent applications, Ser. Nos. 933,658 and 933,660, tilted NEGATIVE WORKING PHOTORESISTS RESPONSIVE TO SHORTER WAVELENGTHS AND NOVEL COATED ARTICLES and NEGATIVE WORKING PHOTORESISTS RESPONSIVE TO LONGER WAVELENGTHS AND NOVEL COATED ARTICLES, respectively, negative working photoresists are disclosed comprised of a film forming component containing ethylenic unsaturation and capable of selective immobilization as a function of ethylenic addition, and activator and photosensitizer coinitiators for ethylenic addition. The activator is an azinium salt, and the photosensitizer is a dye having a reduction potential which in relation to that of the azinium salt activator is at most 0.1 volt more positive.

In concurrently filed, commonly assigned patent application, Ser. No. 933,712, titled DYE SENSITIZED PHOTOGRAPHIC IMAGING SYSTEM essentially similar azinium salt and photosensitizer coinitiators are disclosed in combination with a image dye or its precursor and an organic component containing ethylenic unsaturation sites and capable of being hardened imagewise as a function of addition reactions at the unsaturation sites to immobilize selectively the image dye or its precursor.

SUMMARY OF THE INVENTION

In one aspect this invention is directed to an imaging composition comprised of an organic component containing ethylenic unsaturation sites and capable of selective hardening by addition at the sites of ethylenic unsaturation, an azinium salt activator, a photosensitizer having a reduction potential which in relation to the reduction potential of said azinium salt activator is at most 0.1 volt more positive, and an image enhancing amount of benzene substituted with an electron donating amino group and one or more groups capable of imparting a net Hammett sigma value electron withdrawing characteristic of at least +0.20 volt to said benzene ring.

In another aspect this invention is directed to an article comprising a substrate and a coating comprised of an imaging composition as described above.

It has been discovered quite unexpectedly that hardenable imaging compositions of increased sensitivity are realized when an azinium salt activator, a photosensitizer, and an aniline substituted with one or more groups capable of imparting a net Hammett sigma value electron withdrawing characteristic of at least +0.20 volt, referred to as an enhancer, are employed in combination as coinitiators. In comparative experiments reported in the examples below it has been demonstrated that the enhancer is ineffective in the absence of either the photosensitizer or the azinium salt activator. Further, at visible exposure wavelengths, the azinium salt activators are each ineffective as initiators in the absence of the photosensitizers. Further, the photosensitizers are generally ineffective in the absence of an initiator. Thus, all three coinitiators have been found to be essential to achieving the highest realizable hardening response of the imaging compositions claimed.

In addition to the enhanced sensitivity of the hardenable imaging compositions, the present invention provides other highly desirable imaging properties. First, it has been discovered that when a dye photosenitizer is employed the hardenable imaging compositions are capable of responding efficiently to imaging radiation of blue, green, red, and near infrared wavelengths as well as the near ultraviolet wavelengths of exposing radiation more commonly employed. Second, the hardenable imaging compositions nevertheless exhibit thermal and storage stabilities that compare well with those of hardenable imaging compositions which are responsive to shorter wavelength imaging exposures. By having the capability of responding to longer wavelengths of exposing radiation the hardenable imaging compositions are particularly well suited for imaging masters which rely on differentials in visible wavelength radiation transmission for image definition—i.e., imaging masters which contain visible images. The use of dye photosensitizers particularly lends itself to the formation of multicolor images.

A particularly notable feature of the hardenable imaging compositions of this invention is that they image efficiently with dyes employed as photosensitizers having their principal absorption peak at a wavelength longer than 500 nm (hereinafter referred to as longer wavelength dyes). Further, the dye photosensitizers can be chosen from among both yellow and longer wavelength dyes regardless of the dye class, provided the dye reduction potentials are properly related to that of the azinium salt activator with which they are employed.

Another notable feature is that the dye photosensitizers have been found to be effective even though they exhibit intersystem crossing efficiencies to a triplet state of less than 10 percent. To the limited extent that the art has previously reported photosensitizer coinitiators for azinium activators consideration has been limited to those photosensitizers which exhibit high (greater than 20%) intersystem crossing efficiencies to a triplet state. This selection is based on the reasoning that dye photosensitizers with longer lifetimes above the ground state have a better opportunity to transfer energy to the azinium activator coinitiator.

Of known photosensitizer coinitiators only a few have exhibited significant radiation absorptions extending into the visible spectrum thereby qualifying them to be considered as dyes—specifically, amino-substituted keto coumarin and ketomethylene (i.e., merocyanine) yellow keto dyes. All have exhibited high intersystem crossing efficiencies to a triplet state. None of these photosensitizers have been longer wavelength dyes. It has now been observed that dyes, including longer wavelength dyes, satisfying specified reduction potentials in relation to the azinium activators with which they are employed are generally useful as photosensitizer coinitiators, regardless of the dye class from which they are chosen and regardless of whether they exhibit high or low intersystem crossing efficiencies to a triplet state. The foregoing recognition opens up a much wider choice of dyes than heretofore have been thought to be useful as photosensitizers with azinium activators for hardening by initiation of ethylenic addition reactions.

DESCRIPTION OF PREFERRED EMBODIMENTS

It has been discovered that negative working imaging compositions of the type which undergo hardening by addition reactions at sites of ethylenic unsaturation can be improved in their performance capabilities by the incorporation of an azinium activator, a photosensitizer, and certain specific enhancers acting as coinitiators.

It is the specific recognition of this invention that the sensitivity of the imaging compositions of this invention are improved by including in combination with an azinium salt activator and a photosensitizer a third, enhancer coinitiator—specifically, an aniline which is ring substituted with one or more groups capable of imparting a net Hammett sigma value derived electron withdrawing characteristic of at least +0.20 to the benzene ring. A positive Hammett sigma value is indicative of a substituent which is capable of rendering a phenyl ring electron withdrawing while a negative Hammett sigma value is indicative of a substituent which is capable of rendering a phenyl ring electron donating. Hydrogen is assigned a Hammett sigma value of zero. Lange's Handbook of Chemistry, 12th Ed., McGraw-Hill, 1979, Table 3-12, pp. 3-135 to 3-138, lists Hammett sigma values for a large number of commonly encountered substituents. By algebraically summing the Hammett sigma values of the various ring substituents of the aniline (that is, the ring substituents other than the one required amine substituent) the net Hammett value derived electron withdrawing characteristic of the ring substituents can be determined.

It is to be noted that the amine substituent forming the aniline is an electron donating substituent. For example, the Hammett sigma values of a primary amine group ($-NH_2$); secondary amine groups, such as alkylamino (e.g., $-NHCH_3$, $-NHCH_2CH_3$, and $-NH-n-C_4H_9$); and tertiary amine groups, such as dialkylamino (e.g., $-NCH_3$) range from $-0.04$ to $-0.83$, but are generally more negative than $-0.20$. While it is not intended to be bound by any particular theory to account for the increased effectiveness imparted by the aniline initiator enhancers, it is believed that the molecular polarization created by the presence of both electron donating and electron withdrawing groups attached to the phenyl ring of the aniline can plays a role in the observed increase in initiation activity.

In a preferred form the aniline contains a single ring substituent exhibiting a Hammett sigma value of greater than $+0.20$. The following illustrative substituents, with meta position Hammett sigma values shown parenthetically, are illustrative of useful electron withdrawing substituents which can be employed as the sole aniline ring substituent: cyano ($\sigma = +0.61$), alkylcarbonyl substituents (e.g., acetyl $\sigma = +0.38$ and trifluoroacetyl $\sigma = +0.65$), arylcarbonyl substituents (e.g., phenylcarbonyl $\sigma = +0.34$), oxycarbonyl substituents, including alkoxycarbonyl and aryloxycarbonyl substituents (e.g., methoxycarbonyl $\sigma = +0.32$, ethoxycarbonyl $\sigma = +0.37$), nitro ($\sigma = +0.71$), thiocyanato ($\sigma = +0.63$), perhaloalkyl substituents (e.g., trichloromethyl $\sigma = +0.47$ and trifluoromethyl $\sigma = +0.47$), perfluoroalkylthio substituents (e.g., trifluoromethylthio $\sigma = +0.35$), sulfamoyl substituents, including alkylsulfamoyl and arylsulfamoyl substituents (e.g., sulfamoyl $\sigma = +0.46$), carbonylthio substituents (e.g., acetylthio $\sigma = +0.39$), carbamoylthio substituents (e.g., carbamoylthio $\sigma = +0.34$), oxythio substituents, including alkoxythio and aryloxythio substituents (e.g., methoxythio $\sigma = +0.52$), and sulfonyl substituents, including alkylsulfonyl and arylsulfonyl substituents (e.g., methylsulfonyl $\sigma = +0.68$ and phenylsulfonyl $\sigma = +0.67$). Multiple ring substitutions with these substituents are contemplated.

In addition to the highly electron withdrawing substituents identified above the aniline ring can, but need not, include ring substituents having Hammett sigma value derived electron withdrawing characteristics less positive than +0.20, provided a net Hammett sigma value derived electron withdrawing characteristics of at least +0.20 is maintained. Exemplary simple substituents and their published meta Hammett sigma values are primary and second alkyl substituents, such as methyl $\sigma = -0.07$, ethyl $\sigma = -0.07$, n-propyl $\sigma = -0.05$, i-propyl $\sigma = -0.07$, n-butyl $\sigma = -0.07$, and sec-butyl $\sigma = -0.07$. These alkyl substituents are synthetically convenient and therefore contemplated, though electron donating. Alkyl substituents containing tertiary carbon atoms and particularly tertiary alkyl groups tend to be even more highly electron donating and are not preferred. Aryl groups such as phenyl, $\alpha$-naphthyl, and $\beta$-naphthyl groups are contemplated (e.g., phenyl $\sigma = -+0.06$). Other useful and specifically contemplated hydrocarbon substituents include alkaryl substituents (e.g., p-methylphenyl), aralkyl substituents (e.g., benzyl $\sigma = -0.05$ and phenethyl), alkenyl substituents (e.g. vinyl $\sigma = +0.02$), aralkenyl substituents (e.g., 2-phenylvinyl $\sigma = +0.14$), alkynyl substituents (e.g., ethynyl $\sigma = +0.21$, propargyl, and 2-butynyl), and aralkynyl substituents (e.g., phenethynyl $\sigma = +0.14$). Substituted hydrocarbon substituents are also contemplated, such as haloalkyl substituents (e.g., bromomethyl, chloromethyl $\sigma = -0.12$, fluoromethyl, and iodomethyl), haloaryl substituents (e.g., p-bromophenyl, m-bromophenyl, and p-chlorophenyl, and hydroxyalkyl substituents (e.g., hydroxymethyl $\sigma = +0.08$). Oxy substituents or substituent moieties of hydrocarbon substituents are specifically contemplated—i.e., hydroxy ($\sigma = +0.10$), alkoxy (e.g., methoxy $\sigma = +0.14$, ethoxy $\sigma = +0.07$, n-propoxy $\sigma = +0.07$, i-propoxy $\sigma = 0.00$, n-butoxy $\sigma = -0.05$, cyclohexoxy $\sigma = +0.29$, cyclohexylmethoxy $\sigma = +0.18$, and trifluoromethoxy $\sigma = +0.36$), and aryloxy (e.g., phenoxy $\sigma = +0.25$). Halogen substituents are contemplated—i.e., bromo ($\sigma = +0.39$), chloro ($\sigma = +0.35$), fluoro ($\sigma = +0.34$), and iodo ($\sigma = +0.35$). Amido substituents are also contemplated, such as amido ($\sigma = +0.25$), methylamido ($\sigma = +0.21$), phenylamido ($\sigma = +0.22$), and ureido ($\sigma = +0.18$).

When electron donating or weakly electron withdrawing substituents are employed, they are in every instance employed in combination so that the net Hammett sigma derived value of the various substituents other than the one required amino substituent forming the aniline is greater than +0.20. While meta position Hammett sigma values have been provided, in most instances para position Hammett sigma values are not highly different and can, in any event, be determined by reference to published lists. Ortho Hammett sigma values are usually essentially identical to para position Hammett sigma values. Meta, ortho, and para positions for the various substituents to the aniline are assigned with reference to the position of the amino group forming the aniline. To minimize molecular bulk it is generally preferred that the aliphatic moieties of the various ring substituents each contain 6 or fewer carbon atoms and that the aromatic moieties each contain 10 or fewer carbon atoms.

The azinium salt activators employed in the imaging compositions of this invention can take any convenient form and can be chosen from among known azinium salt activators. The azinium activators disclosed by Heseltine et al and Jenkins et al U.S. Pat. Nos. Re. 27,922 and 27,925, Specht and Farid U.K. No. 2,083,832A, and *Research Disclosure*, Vol. 200, December 1980, Item 20036, cited above, provide a variety of examples of useful azinium activators.

The azinium activators include an azinium nucleus, such as a pyridinium, diazinium, or triazinium nucleus. The azinium nucleus can include one or more aromatic rings, typically carbocyclic armatic rings, fused with an azinium ring. In other words, the azinium nuclei include quinolinium, isoquinolinium, benzodiazinium, and naphthodiazonium nuclei. To achieve the highest attainable activation efficiencies per unit of weight it is preferred to employ monocyclic azinium nuclei.

A quaternizing substituent of a nitrogen atom in the azinium ring is capable of being released as a free radical upon electron transfer from the photosensitizer to the azinium activator. In one preferred form the quaternizing substituent is an oxy substituents. The oxy substituent (—O—R) which quaternizes a ring nitrogen atom of the azinium nucleus can be selected from among a variety of synthetically convenient oxy substituents. The moiety R can, for example, be an alkyl radical, such as methyl, ethyl, butyl, etc.. The alkyl radical can be substituted. For example, arakyl (e.g. benzyl and phenethyl) and sulfoalkyl (e.g., sulfomethyl) radicals are contemplated. In another form R can be an acyl radical, such as an —C(O)—R$^1$ radical, where R$^1$ can take any of the varied forms of alkyl and aralkyl radicals described above. In addition R$^1$ can be an aryl radical, such as phenyl or naphthyl. The aryl radical can in turn be substituted. For example, R$^1$ can be a tolyl or xylyl radical. R typically contains from 1 to 18 carbon atoms, with alkyl moieties in each instance above preferably containing from 1 to 8 carbon atoms and aryl moieties in each instance above containing 6 to 10 carbon atoms. Highest activity levels have been realized when the oxy substituent (—O—R) contains 1 or 2 carbon atoms.

The azinium nuclei need include no substituent other than the quaternizing substituent. However, the presence of other substituents is not detrimental to the activity of the activators. While it is known to include azinium nuclei substituents to increase light absorption by the activator directly, substituents capable of performing this function are not required.

The photosensitizer can be relied upon for the absorption of light, and the azinium nuclei, apart from the quaternizing substituent, can be unsubstituted or, preferably, substituted with comparatively simple groups chosen for properties such as ease of synthetic or physical handling convenience, such as groups chosen from among substituted and unsubstituted aryl substituents of from 6 to 10 carbon atoms (e.g., phenyl or naphthyl) and substituted and unsubstituted alkyl and alkenyl groups of from 1 to 18 carbon atoms, preferably of from 1 to 8 carbon atoms. Activators free of a dye chromophore and therefore having limited ability to absorb visible light offer the advantage of improved stability when exposed to light during synthesis and/or handling. For example, these activators remain stable when synthesized and handled in unfiltered room light.

To the extent that substituents other than the quaternizing nitrogen atom substituent are present in the azinium salts employed, it is preferred that these substituents be electron withdrawing or neutral. When substituents other than the quaternizing nitrogen atom substituent are present which are electron donating, the effect is to shift the reduction potential of the activator to a more negative value. Since the photosensitizer has a reduction which in relation to that of the azinium salt activator is at most 0.1 volt more positive, it is apparent that electron donating substituents have the effect of limiting the selection of dyes which can be employed in combination as useful photosensitizers. However, there remain many photosensitizers having sufficiently negative reduction potentials to be useful in combination with azinium activators having electron donating substituents. Thus, a wide choice of substituents for the azinium salts employed in the present invention are possible. Subject to the considerations indicated above, suitable azinium ring substituents can be illustrated by any one or combination of the various substituents listed for the aniline enhancers described above.

Any convenient charge balancing counter-ion can be employed to complete the activator. Both weakly and highly dissociated counter-ions have been demonstrated to be useful. The counter-ion can be chosen for compatibility with the remaining components of the imaging system. For example, fluorinated carboxylate counter-ions, particularly perfluorinated carboxylate counter-ions, which are relatively undissociated, have been advantageously employed with azinium activators incorporated in oleophilic media, more specifically described below. Nevertheless, it is believed that highest levels of activity can be attributed to azinium activators which are dissociated from charge balancing counter-ions in the imaging composition. While variances in ionic dissociation can be achieved by varied choices of solvents, film forming components, acidity, etc., in general higher levels of counter-ions dissociation occur with more electronegative counter-ions, such as hexafluorophosphate, tetrafluoroborate, perchlorate, para-toluenesulfonate, halide, sulfate, and similar electronegative anions.

Any photosensitizer known to be useful with azinium salt activators can be employed in the imaging compositions of this invention. For example, any of the photosensitizers disclosed by Specht and Farid U.K. No. 2,083,832A or *Research Disclosure* Item 20036, cited above and here incorporated by reference, can be employed.

Dye photosensitizers are specifically preferred. The term "dye" is employed in its art recognized usage to indicate soluble materials capable of absorbing visible light and thereby exhibiting a visible hue. It is the recognition of this invention that useful dye photosensitizers can be elected from any known dye class, provided they exhibit a reduction potential which in relation to that of the azinium activator is at most 0.1 volt more positive.

Whereas it was previously recognized by Specht and Farid U.K. No. 2,083,832A that amino-substituted photosensitizers, including certain keto dyes, specifically keto coumarin dyes and keto methylene dyes (merocyanine dyes), having a principal absorption peak at a wavelength up to 550 nm and exhibiting relatively high intersystem crossing efficiencies are useful as coinitiators in combination with azinium activators, it has now been recognized that dyes having a principal absorption peak at a wavelength longer than 550 nm (hereinafter referred to as longer wavelength dyes) and satisfying the required reduction potentials are highly efficient photosensitizers when used as coinitiators with azinium salt activators. Additionally, it has been recognized that both longer wavelength dyes and shorter wavelength dyes (those exhibiting a principal absorption peak at a wavelength shorter than 550 nm) satisfying the required reduction potentials are highly efficient photosensitizers even when they exhibit relatively low intersystem crossing efficiencies—i.e., intersystem crossing efficiencies of less than 10 percent.

It is therefore apparent that the dyes useful as photosensitizers can exhibit any desired hue appropriate for the imaging application. It is generally preferred to employ a subtractive primary dye as a photosensitizer, particularly, when producing multicolor images. A subtractive primary dye has a principal absorption peak in one of the blue (400 to 500 nm), green (500 to 600 nm), or red (600 to 700 nm) regions of the spectrum and appears yellow, magenta, or cyan.

Among specifically contemplated dye classes from which dyes can be selected are coumarin (including ketocoumarin and sulfonocoumarin) dyes, merocyanine dyes, merostyryl dyes, oxonol dyes, and hemioxonol dyes. Dyes from each of the foregoing classes all contain a keto group in the blue absorbing chromophore and are all therefore designated keto dyes. In addition, it is a specific recognition of this invention that a dye photosensitizer useful in the practice of this invention need not be a keto dye. That is, a keto group in the blue absorbing chromophore of the dye is not essential. Non-keto dyes embrace a variety of dye classes, including non-keto polymethine dyes, rhodamine dyes, anthracene dyes, acridine dyes, aniline dyes, and azo dyes. Non-keto polymethine dyes include cyanine, hemicyanine, and styryl dyes.

In one preferred form of the invention the dye photosensitizers are chosen from the polymethine dye class, which includes the cyanines, merocyanines, complex cyanines and merocyanines (i.e., tri-, tetra- and polynuclear cyanines and merocyanines), oxonols, hemioxonols, styryls, merostyryls, and streptocyanines.

The cyanine dyes include, joined by a methine linkage, two basic heterocyclic nuclei, such as azolium or azinium nuclei, for example, those derived from pyridinium, quinolinium, isoquinolinium, oxazolium, thiazolium, selenazolium, indazolium, pyrazolium, pyrrolium, indolium, 3H-indolium, imidazolium, oxadiazolium, thiadioxazolium, benzoxazolium, benzothiazolium, benzoselenazolium, benzotellurazolium, benzimidazolium, 3H- or 1H-benzoindolium, naphthoxazolium, naphthothiazolium, naphthoselenazolium, naphthotellurazolium, carbazolium, pyrrolopyridinium, phenanthrothiazolium, and acenaphthothiazolium quaternary salts.

Exemplary of the basic heterocyclic nuclei are those satisfying Formulae 1 and 2.

Formula 1

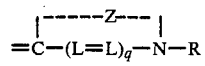

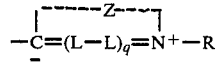

-continued

Formula 2

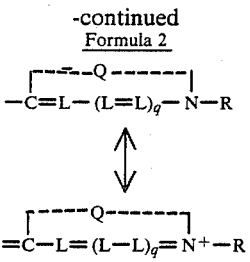

where

Z represents the elements needed to complete a cyclic nucleus derived from basic heterocyclic nitrogen compounds such as oxazoline, oxazole, benzoxazole, the naphthoxazoles (e.g., naphth[2,1-d]oxazole, naphth[2,3-d]oxazole, and naphth[1,2-d]oxazole), oxadiazole, thiazoline, thiazole, benzothiazole, the naphthothiazoles (e.g., naphtho[2,1-d]thiazole), the thiazoloquinolines (e.g., thiazolo[4,5-b]quinoline), phenanthrothiazole, acenaphthothiazole, thiadioxazole, selenazoline, selenazole, benzoselenazole, the naphthoselenazoles (e.g., naphtho[1,2-d]selenazole), benzotellurazole, naphthotellurazoles (e.g., naptho[1,2-d]tellurazole), imidazoline, imidazole, benzimidazole, the naphthimidazoles (e.g., naphth[2,3-d]imidazole), 2- or 4-pyridine, 2- or 4-quinoline, 1- or 3-isoquinoline, benzoquinoline, 3H-indole, 1H- or 3H-benzoindole, and pyrazole, which nuclei may be substituted on the ring by one or more of a wide variety of substituents such as hydroxy, the halogens (e.g., fluoro, chloro, bromo, and iodo), alkyl groups or substituted alkyl groups (e.g., methyl, ethyl, propyl, isopropyl, butyl, octyl, dodecyl, octadecyl, 2-hydroxyethyl, 3-sulfopropyl, carboxymethyl, 2-cyanoethyl, and trifluoromethyl), aryl groups or substituted aryl groups (e.g., phenyl, 1-naphthyl, 2-naphthyl, 4-sulfophenyl, 3-carboxyphenyl, and 4-biphenylyl), aralkyl groups (e.g., benzyl and phenethyl), alkoxy groups (e.g., methoxy, ethoxy, and isopropoxy), aryloxy groups (e.g., phenoxy and 1-naphthoxy), alkylthio groups (e.g., methylthio and ethylthio), arylthio groups (e.g., phenylthio, p-tolylthio, and 2-naphthylthio), methylenedioxy, cyano, 2-thienyl, styryl, amino or substituted amino groups (e.g., anilino, dimethylamino, diethylamino, and morpholino), acyl groups, (e.g., formyl, acetyl, benzoyl, and benzenesulfonyl);

Q represents the elements needed to complete a cyclic nucleus derived from basic heterocyclic nitrogen compounds such as pyrrole, indole, carbazole, benzindole, pyrazole, indazole, and pyrrolopyridine;

R represents alkyl groups, aryl groups, alkenyl groups, or aralkyl groups, with or without substituents, (e.g., carboxy, hydroxy, sulfo, alkoxy, sulfato, thiosulfato, phosphono, chloro, and bromo substituents);

L is in each occurrence independently selected to represent a substituted or unsubstituted methine group—e.g., $-CR^1=$ groups, where $R^1$ represents hydrogen when the methine group is unsubstituted and most commonly represents alkyl of from 1 to 4 carbon atoms or phenyl when the methine group is substituted; and q is 0 or 1.

Cyanine dyes can contain two heterocyclic nuclei of the type shown in Formula 1 joined by a methine linkage containing an uneven number of methine groups or can contain a heterocyclic nucleus according to each of Formulae 1 and 2 joined by a methine linkage containing an even number of methine groups, where the methine groups can take the form $-CR^1=$ as described above. The greater the number of the methine groups linking nuclei in the polymethine dyes in general and the cyanine dyes in particular the longer the absorption wavelengths of the dyes. For example, dicarbocyanine dyes (cyanine dyes containing five methine groups linking two basic heterocyclic nuclei) exhibit longer absorption wavelengths than carbocyanine dyes (cyanine dyes containing three methine groups linking two basic heterocyclic nuclei) which in turn exhibit longer absorption wavelengths than simple cyanine dyes (cyanine dyes containing a single methine group linking two basic heterocyclic nuclei). Carbocyanine and dicarbocyanine dyes are longer wavelength dyes while simple cyanine dyes are typically yellow dyes, but can exhibit absorption maxima up to about 550 nm in wavelength with proper choice of nuclei and other components capable of bathochromically shifting absorption.

One of the techniques for bathochromically shifting the absorption maxima of polymethine dyes in general and cyanine dyes in particular is to include in the methine linkage an oxocarbon bridging nucleus. Exemplary oxocarbon bridging nuclei can take any of the forms indicated by Formula 3.

Formula 3

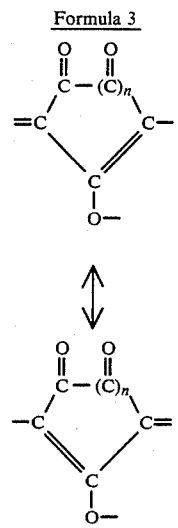

wherein n is the integer 0, 1, or 2.

Merocyanine dyes link one of the cyanine dye type basic heterocyclic nuclei described above to an acidic keto methylene nucleus through a methine linkage as described above, but containing zero, two, or a higher even number of methine groups. Zero methine dyes, those containing no methine groups in the linkage between nuclei, exhibit a double bond linkage between the nuclei in one resonance form and a single bound linkage in another resonance form. In either resonance form the linkage sites in the nuclei are formed by methine groups forming a part of each nucleus. Zero methine polymethine dyes are yellow dyes.

Exemplary acidic nuclei are those which satisfy Formula 4.

Formula 4

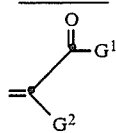

where

G¹ represents an alkyl group or substituted alkyl group, an aryl or substituted aryl group, an aralkyl group, an alkoxy group, an aryloxy group, a hydroxy group, an amino group, or a substituted amino group, wherein exemplary substituents can take the various forms noted in connection with Formulae 1 and 2;

G² can represent any one of the groups listed for G¹ and in addition can represent a cyano group, an alkyl, or arylsulfonyl group, or a group represented by

or G² taken together with G¹ can represent the elements needed to complete a cyclic acidic nucleus such as those derived from 2,4-oxazolidinone (e.g., 3-ethyl-2,4-oxazolidindione), 2,4-thiazolidindione (e.g., 3-methyl-2,4-thiazolidindione), 2-thio-2,4-oxazolidindione (e.g., 3-phenyl-2-thio-2,4-oxazolidindione), rhodanine, such as 3-ethylrhodanine, 3-phenylrhodanine, 3-(3-dimethylaminopropyl)rhodanine, and 3-carboxymethylrhodanine, hydantoin (e.g., 1,3-diethylhydantoin and 3-ethyl-1-phenylhydantoin), 2-thiohydantoin (e.g., 1-ethyl-3-phenyl-2-thiohydantoin, 3-heptyl-1-phenyl-2-thiohydantoin, and arylsulfonyl-2-thiohydantoin), 2-pyrazolin-5-one, such as 3-methyl-1-phenyl-2-pyrazolin-5-one, 3-methyl-1-(4-carboxybutyl)-2-pyrazolin-5-one, and 3-methyl-2-(4-sulfophenyl)-2-pyrazolin-5-one, 2-isoxazolin-5-one (e.g., 3-phenyl-2-isoxazolin-5-one), 3,5-pyrazolidindione (e.g., 1,2-diethyl-3,5-pyrazolidindione and 1,2-diphenyl-3,5-pyrazolidindione), 1,3-indandione, 1,3-dioxane-4,6-dione, 1,3-cyclohexanedione, barbituric acid (e.g., 1-ethylbarbituric acid and 1,3-diethylbarbituric acid), and 2-thiobarbituric acid (e.g., 1,3-diethyl-2-thiobarbituric acid and 1,3-bis(2-methoxyethyl)-2-thiobarbituric acid).

Useful hemicyanine dyes are essentially similar to the merocyanine dyes described above, differing only in substituting for the keto methylene group of Formula 4 the group shown below in Formula 5.

Formula 5

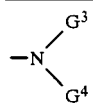

where

G³ and G⁴ may be the same or different and may represent alkyl, substituted alkyl, aryl, substituted aryl, or aralkyl, as illustrated for ring substituents in Formula 1 or G³ and G⁴ taken together complete a ring system derived from a cyclic secondary amine, such as pyrrolidine, 3-pyrroline, piperidine, piperazine (e.g., 4-methylpiperazine and 4-phenylpiperazine), morpholine, 1,2,3,4-tetrahydroquinoline, decahydroquinoline, 3-azabicyclo[3,2,2]nonane, indoline, azetidine, and hexahydroazepine.

Useful hemioxonol dyes exhibit a keto methylene nucleus as shown in Formula 4 and a nucleus as shown in Formula 5 joined by a methine linkage as previously described containing one or a higher uneven number of methine groups.

Useful merostyryl dyes exhibit a keto methylene nucleus as shown in Formula 4 and a nucleus as shown in Formula 6 joined by a methine linkage as described above containing one or a higher uneven number of methine groups.

Formula 6

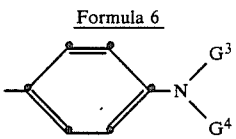

where

G³ and G⁴ are as previously defined.

The cyanine, merocyanine, hemicyanine, hemioxonol, and merostyryl dyes described above are intended to be illustrative of the simpler structural forms of useful polymethine dyes. It is generally recognized that substituents can join the nuclei and methine linkages to form additional cyclic structures. Further, the dyes can contain three or more nuclei. For example, by substituting a merocyanine dye in its methine linkage with a second basic heterocyclic nucleus of the cyanine dye type an allopolar cyanine dye can be formed. Further, the various substituents not forming a part of the dye chromophore can be varied as desired to tailor dye physical properties, particularly hydrophobicity and hydrophillicity, to suit the particular film forming components employed. By choosing as the aliphatic moieties of the dyes hydrocarbon groups having more carbon atoms (e.g., from about 6 to 20 carbon atoms) the dyes can be rendered more oleophilic while hydrocarbon groups containing fewer numbers of carbon atoms (e.g., 1 to 5 carbon atoms) and particularly those bearing polar substituents render the dyes more hydrophilic. The aromatic moieties of the dyes typically contain from 6 to 10 carbon atoms.

In addition to being a dye as previously defined, to be useful as a photosensitizer in the present invention the dye must exhibit a reduction potential which is at most 0.1 volt more positive than the reduction potential of the azinium salt activator with which it is employed. Electron transfer from the photosensitizer to the activator is efficiently achieved when the reduction potential of the longer wavelength dye is more negative than that of the photoactivator. In addition, when the reduction potentials of the photosensitizer and activator are equal, energy transfer can still occur. Further, effective performance has been observed when the reduction potential of the photosensitizer is more positive than that of the activator to a limited degree.

In order then to select suitable dyes for use as photosensitizers it is necessary to compare the reduction potentials of the azinium activator to be employed and the dye. In the overwhelming majority of instances precise determinations of reduction potentials are not required to ascertain that the proper relationship of reduction potentials exists. In those few instances in which the reduction potential of the dye is sufficiently positive with respect to that of the activator that a precise determination of reduction potentials is desired, it must be taken into account that reduction potentials can vary as a function of the manner in which they are measured. To provide a specific standard for reduction potential determinations, the procedure is employed described by J. Lenhard, "Measurement of Reversible Electrode Potentials for Cyanine Dyes by the Use of Phase-Selective Second Harmonic AC Voltammetry", Journal of Imaging Science, Vol. 30, No. 1, January/February 1986.

In addition to contemplating the use of dyes, including longer wavelength dyes, satisfying the reduction potential relationship set forth above as photosensitizers this invention specifically contemplates the use of keto dyes, particularly yellow keto dyes, which exhibit a low intersystem crossing efficiency to a triplet state—that is, an intersystem crossing efficiency of less than 10 percent. Stated another way, it is the recognition of the present invention that dyes having limited excited state lifetimes are nevertheless efficient photosensitizers.

The measurement of intersystem crossing efficiencies of a triplet state are generally known and reported in the art and form no part of this invention. Techniques for measurement of this parameter are well known in the art, as illustrated by Specht, Martic, and Farid, "A New Class of Triplet Sensitizers", Tetrahedron, Vol. 38, pp. 1203-1211, 1982, and the references therein cited.

The remaining essential ingredient of the imaging composition is an organic component containing ethylenic unsaturation sites and capable of selective hardening by addition at the sites of ethylenic unsaturation. A broad variety of vinyl monomers, vinyl oligomers, and polymers containing ethylenic unsaturation are known and useful in imaging systems according to the invention. Specific choices of hardenable organic components are illustrated by reference to certain preferred imaging systems.

In one preferred form of the invention the imaging composition can take the form of a negative working photoresist. The organic component of the negative-working photoresist to be acted upon by the coinitiators can take the form of any conventional negative-working photoresist organic film forming component containing ethylenic unsaturation and capable of selective immobilization by undergoing a hardening addition reaction at the site of the ethylenic unsaturation. Immobilization can be imparted by initiating polymerization of monomers containing ethylenic unsaturation or by initiating crosslinking of linear polymers or oligomers containing ethylenic unsaturation. For example, any of the monomeric or crosslinkable polymeric film forming components disclosed in Jenkins et al and Heseltine et al U.S. Pat. No. Re. 27,925 or 27,922, respectively, are suitable for use in the imaging compositions of this invention and are here incorporated by reference. Tan et al U.S. Pat. No. 4,289,842, here incorporated by reference, discloses negative working hardenable imaging compositions containing light sensitive acrylate copolymers containing pendant groups, such as alkenyl group with ethylenic unsaturation. Lindley U.S. Pat. No. 4,590,147, here incorporated by reference, discloses vinyl oligomers which can be employed as film forming components in the hardenable imaging compositions of this invention. Useful film forming components containing vinyl monomers are disclosed in Fuerniss U.S. Pat. No. 4,497,889 and Anderson et al U.S. Pat. No. 4,535,052, both here incorporated by reference. Kosar *Light-Sensitive Systems,* John Wiley & Sons, 1965, further describes a variety of useful film forming components for use in the practice of this invention, including ethylenically unsaturated monomers and polymers.

Preferred film forming components are comprised of at least one addition polymerizable ethylenically unsaturated compound having a boiling point above 100° C. at normal pressure which is preferably employed in combination with a polymeric binder. The ethylenically unsaturated compound (typically a monomer) and the polymeric binder can be employed together in widely varying proportions, including ethylenically unsaturated compound ranging from 3 to 97 percent by weight of the film forming component and polymeric binder ranging from 97 to 3 percent by weight of the film forming component. A separate polymeric binder, though preferred, is not an essential part of the film forming component and is most commonly omitted when the ethenically unsaturated compound is itself a polymer.

Change U.S. Pat. No. 3,756,827, here incorporated by reference, discloses in column 2, line 36 to column 3, line 30, a variety of suitable organic monomers for use in the hardenable imaging compositions of this invention. Specifically illustrated in the examples below are ester monomers containing ethylenic unsaturation. Similar monomers include ethylenically unsaturated diester polyhydroxy polyethers, described in Chambers U.S. Pat. No. 4,245,031, here incorporated by reference.

Organic polymeric binders which can form a part of the film forming component of the photoresist include: (1) polyesters, including those based on terephthalic, isophthalic, sebacic, adipic, and hexahydroterephthalic acids; (2) nylons or polyamides; (3) cellulose ethers and esters; (4) polyaldehydes; (5) high molecular weight ethylene oxide polymers—e.g., poly(ethylene glycols), having weight average molecular weights from 4000 to 4,000,000; (6) polyurethanes; (7) polycarbonates; (8) synthetic rubbers—e.g., homopolymers and copolymers of butadienes; and (9) homopolymers and copolymers formed from monomers containing ethylenic unsaturation, such as polymerized forms of any of the various the ethylenically unsaturated monomers, such as polyalkylenes—e.g. polyethylene and polypropylene; poly(vinyl alcohol); poly(vinyl esters)—e.g., poly(vinyl acetate); polystyrene; poly(acrylic and methacrylic acids and esters)—e.g., poly(methyl methacrylate) and poly(ethyl acrylate), as well as copolymer variants.

The foregoing is, of course, only an illustrative listing of the most commonly encountered hardenable components. Other specific illustrative hardenable components are included in the examples.

In addition to the hardenable component and the coinitiators the imaging compositions can contain any one or combination of known addenda, such as thermal inhibitors, colorants (including dyes and pigments), plasticizers, fillers, etc. To facilitate coating on a substrate the film forming component, coinitiators, and addenda, if any, are usually dispersed in a solvent to create a solution or slurry, the liquid being evaporatively removed after coating. Any solvent can be employed for this purpose which is inert toward the film forming components and addenda of the photoresist. Solvents can be chosen from among a wide variety of organic liquids, including N,N-dimethylformamide; N,N-dimethylacetamide; alcohols, such as methanol, ethanol, butanol, etc.; ketones, such as acetone, cyclohexanone, and butanone; esters, such as ethyl acetate and ethyl benzoate; ethers, such as tetrahydrofuran and dioxane; chlorinated aliphatic hydrocarbons, such as methylene chloride and 1,2-dichloroethane; aromatic hydrocarbons, such as benzene and toluene; and other common solvents, such as dimethyl sulfoxide, chlorobenzene, and various mixtures of solvents.

The substrates onto which the photoresist is coated can take any convenient conventional form. For example, the photoresist can be used to define a pattern during fabrication of an electronic component. In this instance the substrate can take the from of a printed circuit board or semiconductor chip, typically one which has been only partially fabricated to a completed form. In other instances hardenable imaging compositions can be coated on simple unitary substrates, such as glass, ceramic, metal, cellulose paper, fiberboard, or polymer substrates. Specific substrates include alumina-blasted aluminum, anodized aluminum, alumina-blasted poly(ethylene terephthalate) film, poly(ethylene terephthalate) film, flame or electrostatic discharge treated poly(ethylene terephthalate) film, poly(vinyl alcohol)-coated paper, crosslinked polyester-coated paper, nylon, glass, cellulose acetate film, heavy paper, such as lithographic paper, and the like.

In perhaps their most commonly used form hardenable imaging compositions are coated in a fluid form on a substrate and evaporatively dried, usually with heating, to produce a uniform coating. Often, particularly in the manufacture of semiconductor devices, the substrate is spun, thereby employing centrifugal forces to assure the uniformity of the photoresist coating before drying. After exposure to actinic radiation causes addition to occur at the ethylenic unsaturation sites of the film forming component, a liquid developer is brought into contact with the coated substrate to remove selectively the photoresist in areas which were not exposed to actinic radiation.

The liquid developer can be any convenient liquid which is capable of selectively removing the photoresist in unexposed areas. The coated photoresist can be sprayed, flushed, swabbed, soaked, or otherwise treated with the developer to achieve selective removal. In its simplest form the liquid developer can be the same liquid employed as a solvent in coating the photoresist. Methoxyethyl acetate and ethoxyethyl acetate are common developers. Also aqueous developers are commonly employed, such as miscible combinations of water and alcohols, with proportions in the range of from 20 to 80 percent water and 80 to 20 percent alcohol being common. Exemplary water miscible alcohols include glycerol, benzyl alcohol, 1,2-propanediol, sec-butyl alcohol, and ethers derived from glycols, such as dihydroxy poly(alkylene oxides). Lactone developers, such as those disclosed by Martinson et al U.S. Pat. No. 3,707,373, can be employed. Optimum developer choices for specific hardenable imaging compositions are disclosed in the various patents cited above illustrating the specific film forming components.

In another manner of use, a photoresist layer is coated on a support and overcoated with a strippable cover sheet. The end user typically purchases the photoresist as an article rather than a liquid composition. After removing the cover sheet, the photoresist layer together with its support is laminated to the substrate on which the image pattern is desired. Following patterned exposure to actinic radiation through the support, the support is stripped from the substrate leaving photoresist on the substrate in an imagewise pattern.

In still another manner of use the photoresist is coated on a support surface modified to facilitate electroless metal deposition. Again, a strippable cover sheet is located on the photoresist coating. In this use imagewise exposure to actinic radiation occurs through the cover sheet followed by stripping. Upon stripping of the cover sheet there is selective removal of the photoresist so that remaining photoresist defines the desired pattern. Electroless metal plating can then be undertaken to convert the support into an article having a metal pattern thereon. A common application is in the formation of electrical circuits.

Any conventional ratio of activator to film forming component can be present in the hardenable imaging compositions of this invention. Activator concentrations are as a practical matter most conveniently specified in terms of moles of activator per gram of dry solids, the latter consisting of the film forming component and the minor amounts of various addenda, but excluding any liquid component introduced to facilitate coating. Typically from about $2 \times 10^{-5}$ to $25 \times 10^{-5}$, most preferably from about $5 \times 10^{-5}$ to $20 \times 10^{-5}$ mole of activator is present per gram of dry solids.

In the practice of the present invention the enhancer can be incorporated in the imaging composition in any convenient effective amount. Typically from about 0.1 to 10 moles per mole of activator are employed, preferably about 0.5 to 5 moles per mole of activator, are employed. The use of larger amounts of enhancer is, of course, possible.

The photosensitizer can be present in any concentration capable of increasing the response of the photoresist to ultraviolet or visible light. While the photosensitizer concentration can vary widely, it is generally contemplated to employ photosensitizer in concentrations ranging from about $5 \times 10^7$ to $1 \times 10^{-4}$ mole per gram of dry solids. Preferred photosensitizer concentrations are in the range of from $10^{-6}$ to $5 \times 10^{-5}$ mole per gram of dry solids, with optimum concentrations generally being in the range of from about $2 \times 10^{-6}$ to $2 \times 10^{-5}$ mole per gram of dry solids.

It is possible to employ the various photoresists described above to form either monochromic or multicolor dye images merely by incorporating an imaging dye or dye precursor in the photoresist composition. Following development of the photoresist a retained dye image is presented by the photoresist coating remaining on the substrate. The colored areas correspond to the areas of exposure. Multicolor images, such as images employed for color proofing, can be produced by superimposing three elements each comprised of a transparent support and a photoresist image, where each image is formed by a different additive or substractive primary dye.

In the foregoing imaging systems only a sngle coated layer is required for imaging. However, it is recognized that the imaging systems of the invention can employ multiple layers. For example, instead of blending the imaging dye with the film forming component as described above, a separate imaging dye layer can be coated between the substrate and the photoresist layer. Upon imagewise exposure and development the photoresist is removed in exposed areas. Where the photoresist remains the underlying image dye remains in its initial immobilized condition, while in other areas the dye can be removed or decolorized by washing or any other convenient technique.

In the foregoing description of photoresists the hardenable organic component containing ethylenic unsaturation sites is a film forming component. However, in certain preferred imaging systems of the invention the hardenable organic component can be present as a discontinuous or internal phase forming microcapsules which can be in contact with a surrounding continuous phase or separated therefrom by intervening rupturable encapsulating walls. While it is possible to coat microcapsules each containing the hardenable organic component, coinitiators, and imaging dye or dye precursor to form a single color image, the present invention makes possible the formation of multicolor images employing a single layer of microcapsules coated on a support. Since the microcapsules form discrete packets of materials, it is possible to mix in the same layer microcapsules containing dye photosensitizers which absorb at differing locations in the visible spectrum and imaging dyes (or their precursors) of differing imaging hues. For example, it is contemplated to coat as a single layer on a substrate (a) microcapsules containing a yellow dye photosensitizer and a yellow or blue imaging dye or its precursor, (b) microcapsules containing a magenta dye photosensitizer and a magenta or green imaging dye or its precursor, and (c) microcapsules containing a cyan dye photosensitizer and a cyan or red imaging dye or its precursor. Except for the choice of dye photosensitizer and imaging dye the microcapsules can be otherwise identical. Thus, merely by blending three differing populations of microcapsules it is possible to obtain multicolor images with the same ease and facility as monochromic dye images are obtained. Except for hue selection of components and blending of microcapsule populations prior to coating, monochromic and multicolor imaging according to this invention are identical. Therefore, for simplicity the description which follows is in terms of monochromic imaging, but the description is applicable to both monochromic and multicolor imaging, except as specifically noted.

The microcapsules can be employed to produce either a retained or a transferred dye image. Further, either a preformed dye or, preferably, a dye precursor can be contained in the microcapsules.

In the retained imaging system a receiver layer is coated on a substrate and is overcoated by a layer of microcapsules. Within each coated microcapsule exposure to light which is absorbed by the dye photosensitizer results in release of a free radical by the azinium activator which in turn results in hardening of the organic component containing ethylenic unsaturation. Subsequent uniform rupture of all the coated microcapsules, as by passing the exposed element between pressure rollers, results in migration of imaging dye or its precursor from the microcapsules which were not exposed and hence were not internally hardened.

The released dye or dye precursor diffuses into the receiver layer. Where an imaging dye is contained in the microcapsules, the receiver layer can be formed of any convenient transparent dye penetrable material. For example, the dye can enter a hydrophilic colloid layer or film forming polymer layer. Preferably a mordant is present in the receiver layer to immobilize the image dye on receipt.

When the microcapsules contain a dye precursor, the dye image forming layer contains a second component capable of interacting with the dye precursor to form the image dye. One of the two components is hereinafter referred to as a chromogenic material and the other is referred to as a developer. Either or both can be viewed as a dye precursor and either can be located within the microcapsules with the other located in the dye image forming layer in monochromic imaging. However, for multicolor imaging the chromogenic materials, which differ based on the hue of the dye to be produced, are located within the microcapsules. For simplicity subsequent discussion is directed to chromogenic materials contained in the microcapsules with developer being located in the receiver layer, but the converse arrangement is possible, except as specifically noted. The receiver layer can be similar to the receiver for a preformed imaging dye, differing only by the additional inclusion of a developer.

Transferred dye image systems can be similar to the retained dye image systems described above, but differ in the location of the receiver layer. Instead of coating the receiver layer on the same support as the microcapsules, the receiver layer is coated on a separate support. In integral format arrangements the receiver layer and its support can be associated with the microcapsule layer and its support at the time of exposure as well as at the time transfer to the receiver from the microcapsules occurs. Alternatively, the receiver layer and its support need not be associated with the microcapsule layer until rupture of the microcapsules occurs. In either arrangement the receiver layer and its support can be employed alone as the image bearing element or can be retained with the microcapsule layer and its support. In the latter instance the photobleachability of the photosensitizer and the initially colorless form of the chromogenic material are particularly advantageous.

In general similar materials can be employed in forming the microcapsule systems described above as have been previously described in connection with negative-working photoresists, the principal difference being in the physical continuity of the imaging layer. However, certain materials described below have been found to be particularly well suited to use in microcapsule imaging systems and constitute preferred materials.

Preferred hardenable organic components containing ethylenic unsaturation include compounds containing at least one terminal ethylenic group per molecule and preferably two or more terminal ethylenic groups per molecule. Typically they are liquid and can also double as a carrier oil for the chromogenic material in the internal phase. Representative examples of these compounds include ethylenically unsaturated acid esters of polyhydric alcohols such as trimethylol propane triacrylate. Another preferred hardenable component can include an acrylate prepolymer derived from the partial reaction of pentaerythritol with acrylic acid or acrylic acid ester. Such materials are available from Richardson Company, Melrose Park, Ill.—e.g. R1-1482 and R1-1483. Also useful are isocyanate modified acrylate, methacrylate, and itaconic acid esters of polyhydric alcohols, such as disclosed by Carlick et al U.S. Pat. Nos. 3,825,479; 3,759,809; and 3,783,151.

The chromogenic materials used in the present invention are preferably oil soluble color formers which produce a dye upon reaction with a developer in the presence of a carrier oil. Representative examples of such chromogenic materials include substantially colorless compounds including a lactone, lactam, sultone, spiropyran, ester, or amido structure. Specifically preferred chromogenic materials are triarylmethane, bisphenylmethane, xanthene, thiazine, spiropyran, and similar compounds. Also useful as chromogenic materials are organic compounds capable of complexing with heavy metals to form dyes—e.g., copper phthalocyanine. Specific additive and substractive dye forming chromogenic materials are disclosed in U.S. Pat. Nos. 3,920,510; 4,399,209; and 4,440,846, here incorporated by reference.

In addition to the hardenable organic component, the coinitiators, and the chromogenic material, the discrete phase or microcapsules can also contain a carrier oil. Preferred carrier oils are weakly polar solvents having boiling points above 170° C. and preferably in the range of from 180° C. to 300° C. Exemplary carrier oils include alkylated biphenyls (e.g., monoisopropylbiphenyl), polychorinated biphenyls, caster oil, mineral oil, deodorized kerosene, naphthenic mineral oils, dibutyl phthalate, dibutyl fumerate, brominated paraffin, and mixtures thereof. Alkylated biphenyls are preferred on the basis of low toxicity while brominated paraffins employed in combination with trimethylol propane triacrylate are particularly preferred for halftone imaging.

Carrier oils are not required. As previously noted the hardenable organic component can in many instances perform the mobility providing function of a carrier oil, particularly where the hardenable organic component is a monomer. The choice of carrier oil will depend to some extent on the chromogenic material to be transported on rupture of the microcapsule. Carrier oils are chosen on the basis of their ability to impart mobility to the chromogenic material in the absence of hardening of the organic component containing ethylenic unsaturation as well as being nonreactive with the various components of the microcapsules.

The internal phase forming the microcapsules is then comprised of the hardenable organic component, an optional carrier oil, a chromogenic material, coinitiators, and any of a variety of optional components intended to offer improvement in imaging properties, such as light scattering materials, stabilizers, and the like.

The materials forming the internal phase of the microcapsules can be present in generally similar concentration ranges as previously described in connection with photoresists. In general the hardenable organic component constitutes at least about 40 percent by weight of the internal phase and typically constitutes from about 50 to 99 percent by weight of the internal phase. The chromogenic material can be present in any concentration compatible with providing a visible dye image. In general useful concentrations range from about 0.5 to 20.0 percent by weight, based on the weight of the internal phase. A preferred range of chromogenic material for monochromic imaging is from about 2 to 7 percent by weight of the internal phase. In multicolor imaging a somewhat higher concentration of chromogenic material is preferred, since only a third of the microcapsules are available to provide a maximum image dye density of any primary hue. For example, a maximum density magenta image must be formed using only the one third of the microcapsules containing the chromogenic material which forms a magenta dye. A preferred range of chromogenic material for multicolor imaging is from about 5 to 15 percent by weight of the internal phase. Carrier oils are not required, but can be present in concentrations of up to about 50 percent by weight of the internal phase, preferably in concentrations of from about 10 to 40 percent of the internal phase. The coinitiators can be present in the same concentrations set out above for the photoresists, where the dry solids percentage bases correspond to internal phase percentage bases for the microcapsule utility.

In preferred forms the microcapsules each include in addition to the internal phase a rupturable surrouding encapsulating wall. Encapsulation can be undertaken in any convenient conventional manner. Oil soluble chromogenic materials have been encapsulated in hydrophilic wall forming materials, such as gelatin and gelatin derivatives (e.g., phthalated gelatin), gum arabic, polyvinyl alcohol, and carboxymethylcellulose wall forming materials, as illustrated by Green et al U.S. Pat. Nos. 2,730,456 and 2,800,457; resorcinol-formaldehyde wall formers, as illustrated by Vassiliades U.S. Pat. No. 3,914,511; isocyanate-polyol wall formers, as illustrated by Kiritani et al U.S. Pat. No. 3,796,669; urea-formaldehyde wall formers, particularly urea-resorcinol-formaldehyde wall formers, as illustrated by Foris et al U.S. Pat. Nos. 4,001,140, 4,087,376, and 4,089,802; melamine-formaldehyde resin wall formers; and hydroxypropyl cellulose wall formers, as illustrated by Shackle U.S. Pat. No. 4,025,455; all of the forgoing patents being here incorporated by reference. The wall formers must, of course, be capable of transmitting exposing radiation. Preferred wall formers are gelatin and gelatin derivatives as well as urea-resorcinol-formaldehyde wall formers. Microencapsulation can be accomplished by any convenient conventional technique, including coacervation, interfacial polymerization, polymerization of one or more monomers in oil, as well as various melting dispersing, and cooling methods.

The microcapsules normally are chosen to be of a size too small to be individually discerned by the unaided eye. The microcapsules preferably range from about 1 to 25 micrometers ($\mu$m) in diameter, more typically from about 3 to 15 $\mu$m in diameter, depending upon the sharpness of the image desired, the smoothness of the support surface, and the technique used for rupturing the microcapsules. Generally the sharpness of the dye image increases as the size of microcapsules decreases. However, smaller microcapsules are less easily coated on rough surface supports and less easily ruptured uniformly by mechanical techniques.

The microcapsules are normally coated at a density sufficient to at least cover the surface of the support. That is, based on the average diameter of the microcapsules the coating coverage is chosen to provide at least a monolayer coverage of microcapsules on the support.

Instead of forming the microcapsules with discrete walls, it is appreciated that microcapsule containing compositions suitable for coating on a substrate can be produced by forming an emulsion in which the microcapsules constitute the discontinuous or internal phase and a binder analogous to the wall formers above constitutes the continuous phase. For example, such microcapsule coatings can be formed employing hydrophilic binders, such as hardened gelatin and gelatin derivatives.

Reacting with the chromogenic material (or first dye precursor) is a developer (or second dye precursor). The developer can take the form of any material capable of reacting with the chromogenic material to produce a dye. For the preferred classes of chromogenic materials identified above illustrative developers include clay minerals, such as acid clay, and active clay attapulgite; organic acids such as tannic acid, gallic acid, and propyl gallate; acid polymers, such as phenol-formaldehyde resins; condensates of carboxylic acids containing at least one hydroxy group and formaldehyde; metal salts of aromatic carboxylic acids, such as zinc salicylate, tin salicylate, zinc 2-hydroxynaphthenoate, zinc 3,5-di-tert-butylsalicylate; oil soluble metal salts of phenol-formaldehyde novolak resins (more specifically illustrated by U.S. Pat. Nos. 3,672,935; 3,732,120; and 3,737,410), zinc carbonate, and mixtures of the above.

When the developer is coated on a substrate, as is preferred, the developer is typically dispersed in a binder. The binder is chosen to be relatively dye permeable inert material, such as poly(vinyl alcohol), gelatin or a gelatin derivative, maleic anhydride-styrene copolymer, starch, gum arabic, or a cellulose ester. In general well known film forming binders are useful. As mentioned above, a mordant can be incorporated in the binder for the developer to assist in immobilizing the dye once it is formed. A variety of mordants particularly compatible with gelatin and gelatin derivatives are disclosed by Hartman U.S. Pat. No. 4,315,978.

While the microcapsule containing imaging system has been described above in terms of employing a chromogenic material and a developer, it is appreciated that mobile imaging dyes can be substituted for the the chromogenic material, if disired. The advantage of employing chromogenic materials is that the chromogenic material need contain no chromophore to compete with the dye photosensitizer for photon dye capture. Further, the chromogenic material minimizes coloration of the imaging system in areas where no image dye is formed.

While the preferred microcapsule imaging systems above have been described in terms of forming a discontinuous oleophilic phase in a continuous hydrophilic phase, it is appreciated that the reverse relationship is also possible. It is specifically contemplated to form microcapsules containing dyes or chromogenic materials which are more hydrophilic and to rely on the relative hydrophobicity if not impermeability of the microcapsule walls to initially confine the dyes. Where microcapsule wall formers are present, the same relatively hydrophilic binders described above can still be employed. The important point to note is that an extremely broad range of imaging dyes and chromogenic materials are available for use. Hartman U.S. Pat. No. 4,315,978 illustrates a variety of yellow, magenta, and cyan dyes containing polar substituents to impart mobility in more hydrophilic media.

While a few diverse imaging systems which constitute preferred embodiments of the invention have been specifically described, it is apparent that still other imaging systems employing an organic component which is hardenable by addition at sites of ethylenic unsaturation can also be improved by the incorporation of coinitiators as previously described.

EXAMPLES

The invention can be better appreciated by reference to the following specific examples.

Examples 1 Through 8

A series of imaging compositions each containing 0.02 millimole of a different dye being tested as a photosensitizer were prepared.

The imaging compositions were formulated as follows:
2.34 g Binder A
1.17 g Monomer B
1.17 g Monomer C
0.012 g Inhibitor D
0.21 g Enhancer E
0.077 g Activator F
$2 \times 10^{-5}$ mole Photosensitizer
10.32 g Solvent (Dichloromethane)

Binder A exhibited the following structure

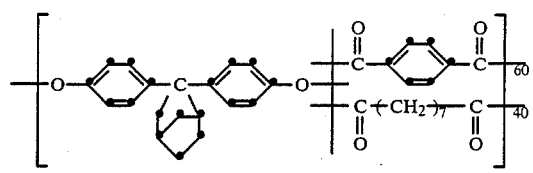

Monomer B exhibited the following structure

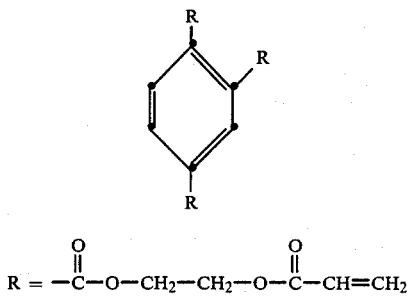

$$R = -\overset{O}{\underset{\|}{C}}-O-CH_2-CH_2-O-\overset{O}{\underset{\|}{C}}-CH=CH_2$$

Monomer C exhibited the following structure

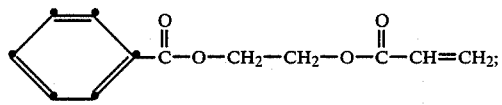

Inhibitor D exhibited the following structure

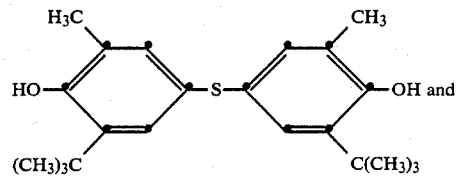

Enhancer E was ethyl dimethylaminobenzoate.

Activator F was 1-methoxy-4-phenylpyridinium tetrafluoroborate.

Each of the imaging compositions was coated on a copper sheet using a 0.3 mm coating knife and dried for 10 minutes at about 70° C. A transparent polypropylene cover sheet was then placed over the coating.

Since imaging composition without the photosensitizer coinitiator responds to ultraviolet exposures, shorter wavelengths were removed during exposure using filters. Specifically, wavelengths below the absorption peak of the photosensitizer dye were removed using a W-2A, W-16, or W-25 Wratten ® filter capable of filtering 99.9 percent of radiation of less than 400, 510, or 580 nm in wavelength, respectively. Exposure of each coated sample was undertaken through a Kodak T-14 ® step tablet having 14 equal increment density steps ranging in density from essentially zero to 2.1. Three minute exposures were undertaken using a Nuarc FT32L ® flip-top platemaker equipped with a 4000 watt pulsed Xenon lamp. After exposure the samples were baked for 10 minutes at 70° C. and spray developed. Development was undertaken using 1,1,1-trichloroethane as a developer. Response was measured in terms of the number of stepped exposure areas (steps) in which the photoresist was retained following exposure. For example, a photoresist sample which was retained following exposure and development on 10 steps, but was absent from the remaining four steps was assigned a step rating of 10. If partial retention of the imaging composition was observed on the eleventh step, this was indicated by assigning a plus rating—i.e., 10+. On the other hand, where the photoresist retention was deemed just barely adequate to merit the step rating, this was indicated by assigning a minus rating—i.e., 10−.

Results with various dye photosensitizers are indicated below in Table I. In each instance results are also shown for a pair of control imaging compositions one of which lacked the Enhancer E or the remaining of which lacked the Activator F.

TABLE I

| | | | | Activator F | Enhancer E | E + F |
|---|---|---|---|---|---|---|
| | Y | n | R | X | | |
| PS-1 | —S— | 1 | —CH$_2$CH$_3$ | C$_3$F$_7$COO$^-$ | 10 | 0 | 11$^-$ |
| PS-2 | —O— | 3 | —CH$_2$CH$_3$ | I$^-$ | 4 | 0 | 6$^+$ |
| PS-3 | —C(CH$_3$)$_2$— | 2 | —CH$_3$ | I$^-$ | 4 | 0 | 5 |
| PS-4 | —CH=CH— | 0 | —C$_4$H$_9$—n | I$^-$ | 2 | 0 | 4 |
| PS-5 | R = CH$_3$ | | | | 9$^+$ | 0 | 11 |
| PS-6 | R = C$_6$H$_5$ | | | | 9-10 | 0 | 11 |
| PS-7 | | | | | 12$^+$ | 1$^a$ | 13$^-$ |
| PS-8 | | | | | 8$^+$ | 0 | 10 |

$^a$This coumarin derivative with neither Activator F nor Enhancer E gives 2 steps.

From Table I it is apparent that in no instance did the Enhancer E when employed with only the photosensitizer as a coinitiator function as an activator. When the Enhancer E was employed in combination with the Activator F, in every instance an increase in sensitivity was observed.

When the imaging compositions were varied only by omitting the dye photosensitizer, performance of the procedure described above and including the filters used for exposures with the dyes present resulted in no imaging response being observed. This showed the activator to be ineffective to impart sensitivity to the imaging composition in the visible region of the spectrum.

The wavelengths of the principal absorption peak of each dye photosensitizer reported in Table I is as follows:

| | |
|---|---|
| PS-1 | ___ nm |
| PS-2 | 702 nm |
| PS-3 | 650 nm |
| PS-4 | 532 nm |
| PS-5 | 642 nm |
| PS-6 | 652 nm |
| PS-7 | 447 nm |
| PS-8 | 592 nm |

Examples 9 Through 15

The procedure of Examples 1 through 8 were repeated using dye photosensitizer PS-6 in combination with the Activator F and varied enhancers. The results are reported below in Table II.

TABLE II (benzene ring with R substituent and $N(CH_3)_2$ substituent)

| R | No. of Steps |
|---|---|
| $COOC_2H_5$ | 11 |
| $COCH_3$ | 11 |
| CHO | $11^+-12^-$ |
| $COC_6H_5$ | $10^+-11^-$ |
| CN | $10^+-11^-$ |
| no enhancer present | 9–10* |
| H | 9–10* |

*Controls

When no enhancer was present, the results were consistent with that reported above in Table I. Also no enhancement of sensitivity was observed when the benzene ring was unsubstituted except for the amino substituent. This demonstrates the importance of electron withdrawing substitution of the benzene ring to obtaining a useful enhancer coinitiator.

The invention has been described in detail with particular reference to preferred embodiments thereof, but it will be understood that variations and modifications can be effected within the spirit and scope of the invention.

What is claimed is:

1. An imaging composition consisting essentially of
   an organic component chosen from the class consisting of monomers, oligomers, and polymers each containing ethylenic unsaturation and capable of selective hardening by addition at the sites of ethylenic unsaturation,
   an effective amount of a quaternized azinium salt activator,
   a concentration sufficient to increase response of the photoresist to light of a photosensitizer having a reduction potential which in relation to the reduction potential of said azinium salt activator is at most 0.1 volt more positive, and
   an image enhancing amount of benzene substituted with an electron donating amino group and one or more groups capable of imparting a net Hammett sigma value electron withdrawing characteristic of at least +0.20 volt to said benzene ring.

2. An imaging composition according to claim 1 in which said organic component is comprised of at least one addition polymerizable ethylenically unsaturated compound having a boiling point above 100° C. at normal pressure.

3. An imaging composition according to claim 2 in which said polymerizable ethylenically unsaturated compound is a monomer.

4. An imaging composition according to claim 2 in which said polymerizable ethylenically unsaturated compound is an oligomer.

5. An imaging composition according to claim 2 in which said polymerizable ethylenically unsaturated compound is a crosslinkable polymer.

6. An imaging composition according to claim 1 in which said photosensitizer exhibits a reduction potential that is more negative than the reduction potential of said azinium activator.

7. An imaging composition according to claim 1 in which said photosensitizer is a dye.

8. An imaging composition according to claim 7 in which said photosensitizer is a polymethine dye.

9. An imaging composition according to claim 8 in which said dye photosensitizer is a cyanine dye.

10. An imaging composition according to claim 1 in which said activator is present in a concentration of from $2 \times 10^{-5}$ to $25 \times 10^{-5}$ mole per gram of dry solids and said amino group substituted benzene is present in a concentration of from 0.1 to 10 moles per mole of activator.

11. An imaging composition according to claim 1 in which said amino group substituted benzene is additionally substituted with an electron withdrawing group having a Hammett sigma value electron withdrawing characteristic of at least +0.20 volt.

12. An imaging composition according to claim 11 in which said electron withdrawing group is a cyano, alkylcarbonyl, arylcarbonyl, oxycarbonyl, nitro, thiocyanato, perhaloalkyl, perfluoroalkylthio, sulfamoyl, carbonylthio, carbamoylthio, oxythio, or sulfonyl substituent, wherein aliphatic moieties contain 6 or fewer carbon atoms and aromatic moieties contain 10 or fewer carbon atoms.

13. An imaging composition according to claim 10 in which said amino substituted benzene compound is present in a concentration of from 0.5 to 5 moles per mole of said activator.

14. An imaging composition according to claim 1 wherein said photosensitizer is present in a concentration ranging from $5 \times 10^{-7}$ to $1 \times 10^{-4}$ mole per gram of dry solids.

15. An imaging composition according to claim 1 wherein said activator is present in a concentration of from $2 \times 10^{-5}$ to $25 \times 10^{-5}$ mole per gram of dry solids.

16. An imaging composition according to claim 14 wherein said photosensitizer is present in a concentration ranging from $10^{-6}$ to $5 \times 10^{-5}$ mole per gram of dry solids.

17. An imaging composition according to claim 1 wherein said azinium salt activator is free of a dye chromophore and is stable in unfiltered room light.

18. An imaging composition according to claim 1 wherein said substituted benzene consists of a benzene ring, an electron donating amino group as a first substituent of said benzene ring, and one additional electron withdrawing group as a second substituent of said benzene ring.

19. An imaging composition consisting essentially of
an organic component chosen from the class consisting of monomers, oligomers, and polymers each containing ethylenic unsaturation and capable of selective hardening by addition at the sites of ethylenic unsaturation, an effective amount of a quaternized azinium salt activator which is free of a dye chromophore and is stable in unfiltered room light, a concentration sufficient to increase response of the imaging composition to light a photosensitizer having a reduction potential which in relation to the reduction potential of said azinium salt activator is at most 0.1 volt more positive, and an image enhancing amount of a substituted benzene consisting of a benzene ring, an electron donating amino group as a first substituent, and, as a second substituent, a group capable of imparting a Hammett sigma value electron withdrawing characteristic of at least $+0.20$ volt to said benzene ring.

20. An imaging composition according to claim 19 wherein said second substituent is chosen from the class consisting of $-COOC_2H_5$, $-COCH_3$, $-CHO$, $-COC_6H_5$, and $-CN$.

* * * * *